US 10,665,286 B2

(12) United States Patent
Mori et al.

(10) Patent No.: US 10,665,286 B2
(45) Date of Patent: May 26, 2020

(54) PSEUDO STATIC RANDOM ACCESS MEMORY AND CONTROL METHOD THEREOF

(71) Applicant: Winbond Electronics Corp., Taichung (TW)

(72) Inventors: Kaoru Mori, Kanagawa (JP); Hitoshi Ikeda, Kanagawa (JP)

(73) Assignee: Windbond Electronics Corp., Taichung (TW)

( * ) Notice: Subject to any disclaimer, the term of this patent is extended or adjusted under 35 U.S.C. 154(b) by 82 days.

(21) Appl. No.: 16/177,461

(22) Filed: Nov. 1, 2018

(65) Prior Publication Data

US 2019/0237123 A1 Aug. 1, 2019

(30) Foreign Application Priority Data

Feb. 1, 2018 (JP) .................................. 2018-016458

(51) Int. Cl.
| | |
|---|---|
| *G11C 16/04* | (2006.01) |
| *G11C 11/406* | (2006.01) |
| *G11C 11/4076* | (2006.01) |
| *G11C 11/408* | (2006.01) |
| *G11C 11/409* | (2006.01) |
| *G11C 7/10* | (2006.01) |

(52) U.S. Cl.
CPC .......... *G11C 11/406* (2013.01); *G11C 11/409* (2013.01); *G11C 11/4076* (2013.01); *G11C 11/4087* (2013.01); *G11C 11/40615* (2013.01); *G11C 7/1045* (2013.01); *G11C 2211/4065* (2013.01); *G11C 2211/4066* (2013.01)

(58) Field of Classification Search
CPC ............ G11C 11/406; G11C 11/40615; G11C 11/4076; G11C 11/4087; G11C 11/409
USPC .................. 365/189.07, 189.05, 230.08, 233
See application file for complete search history.

(56) References Cited

U.S. PATENT DOCUMENTS

| | | | |
|---|---|---|---|
| 7,433,996 B2 | 10/2008 | Fang et al. | |
| 2005/0232065 A1* | 10/2005 | Jeong ................... | G11C 7/1045 365/233.1 |
| 2011/0058442 A1* | 3/2011 | Fujisawa ................ | G11C 5/063 365/233.1 |

(Continued)

FOREIGN PATENT DOCUMENTS

| | | |
|---|---|---|
| CN | 100409365 | 8/2008 |
| TW | I333211 | 11/2010 |

*Primary Examiner* — Connie C Yoha
(74) *Attorney, Agent, or Firm* — JCIPRNET

(57) ABSTRACT

In a control method, external data input to the pseudo static random access memory with a reference clock signal in a write operation are counted to generate a first count value. Data written to a dynamic memory array of the pseudo static random access memory with a built-in clock signal in the write operation are counted to generate a second count value. An initial cycle of the built-in clock signal is smaller than a cycle of the reference clock signal. The first count value is compared with the second count value. When the first count value is equal to the second count value, a write match signal is enabled. When the enabled write match signal is received, the write operation is converted from an asynchronous mode to a synchronous mode to adjust the cycle of the built-in clock signal to be equal to the cycle of the reference clock signal.

10 Claims, 9 Drawing Sheets

(56) References Cited

U.S. PATENT DOCUMENTS

2011/0167292 A1* 7/2011 Bohno ..................... G06F 1/12
                                                            713/400

* cited by examiner

PSEUDO STATIC RANDOM ACCESS MEMORY AND CONTROL METHOD THEREOF

CROSS-REFERENCE TO RELATED APPLICATION

This application claims the priority benefit of Japan application serial no. 2018-016458, filed on Feb. 1, 2018. The entirety of the above-mentioned patent application is hereby incorporated by reference herein and made a part of this specification.

BACKGROUND OF THE INVENTION

Field of the Invention

The invention relates to a control method of memory, and more particularly to a control method of a pseudo static random access memory.

Description of Related Art

The pseudo static random access memory is a memory element having the unit structure of dynamic random access memory and the peripheral circuit of static random access memory. Although the pseudo static random access memory has the advantages of large capacity and low cost, the need of regularly performing refresh action should be considered. Current pseudo static random access memory has a problem that a time for a refresh action between the write operation is limited to be short, and it causes decrease of data retention time. The refresh cycle may be shortened correspondingly to avoid errors, but it causes standby current increase and thereby increases the power consumption. If a more complex control is applied to the refresh action and the refresh cycle in order to avoid standby current increase, the control logic circuit becomes more complex and the chip size and the cost also increases.

SUMMARY OF THE INVENTION

A pseudo static random access memory and a control method thereof that allow a longer time for performing the refresh action by reducing the required time for the write operation are provided.

A pseudo static random access memory of the invention includes a dynamic memory array, a controller and an input output circuit. The controller is coupled to the dynamic memory array. The input output circuit is coupled to the dynamic memory array and the controller. The controller includes a first counter, a second counter, a comparer, and an address strobe clock generator. In a write operation, the first counter counts data input to the pseudo static random access memory from external with a reference clock signal to generate a first count value. In the write operation, the second counter counts data written to the dynamic memory array with a built-in clock signal to generate a second count value. An initial cycle of the built-in clock signal is smaller than a cycle of the reference clock signal. The comparer is coupled to the first counter and the second counter and compares the first count value and the second count value. When the first count value is equal to the second count value, the comparer enables a write match signal. The address strobe clock generator is coupled to the comparer. When the enabled write match signal is received, the address strobe clock generator converts the write operation from an asynchronous mode to a synchronous mode to adjust the cycle of the built-in clock signal to be equal to the cycle of the reference clock signal.

Based on the foregoing, the invention performs the same write operation respectively in the asynchronous mode and in the synchronous mode. When a number of data provided to an input end buffer of the pseudo static random access memory is still greater than a number of data already written to a memory unit of the dynamic memory array at the beginning, the data are written to the memory unit with the built-in clock signal having the cycle smaller than the cycle of the reference clock signal, and the two numbers of data gradually equal. When the two numbers of data equal, the cycle of the built-in clock signal is adjusted to be equal to the cycle of the reference clock signal. As such, the required time for the write operation effectively reduces without complex control, thus a longer time is allowed for performing the refresh action and the error and power consumption reduce thereby.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
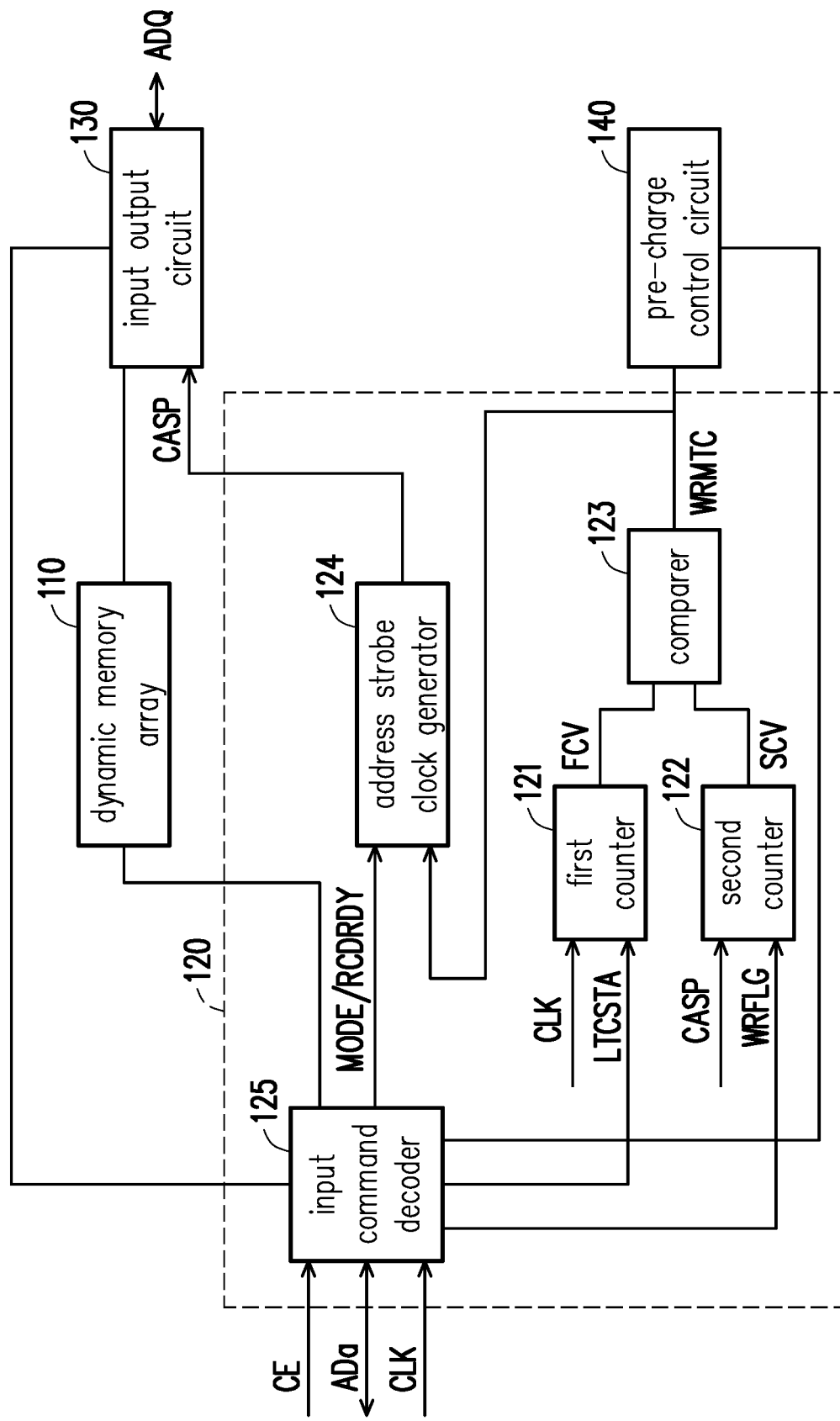
FIG. 1 is a schematic circuit diagram of a pseudo static random access memory according to an embodiment of the invention.

Please refer to FIG. 1 for the following. FIG. 1 is a schematic circuit diagram of a pseudo static random access memory according to an embodiment of the invention. A pseudo static random access memory 100 includes a dynamic memory array 110, a controller 120, an input output circuit 130 and a pre-charge control circuit 140. The controller 120 is coupled to the dynamic memory array 110. The input output circuit 130 is coupled to the dynamic memory array 110 and the controller 120, wherein the controller 120 includes a first counter 121, a second counter 122, a comparer 123, an address strobe clock generator 124 and an input command decoder 125. The comparer 123 is coupled to the first counter 121 and the second counter 122. The first counter 121 is adapted to count data input to the input output circuit 130 of the pseudo static random access memory 100 from external (for example, input by a data port signal ADQ) with a reference clock signal CLK to generate a first count value FCV. The second counter 122 is adapted to count data written to a dynamic memory array 110 by the input output circuit 130 with a built-in clock signal CASP to generate a second count value SCV. Generally speaking, when performing a write operation, data are first input to a buffer of the input output circuit 130 from external and then written to the dynamic memory array 110 by the input output circuit 130. However, when the data starts being input to the input output circuit 130 from external, some circuit delays or control delays occur before the data start being written to a memory unit of the dynamic memory array 110. Therefore, in this embodiment, at the beginning of performing the write operation, an initial cycle of the built-in clock signal GASP is set to be smaller than a cycle of the reference clock signal CLK in an asynchronous manner so as to make a speed of writing the data to the dynamic memory array 110 faster than a speed of inputting the data from external to the input output circuit 130, and thereby a number of data already written to the dynamic memory array 110 gradually catches up a number of data input from external to the pseudo static random access memory 100.

In FIG. 1, the comparer 123 compares the first count value FCV and the second count value SCV and enables a write match signal WRMTC when the first count value FCV is equal to the second count value SCV. In other words, when the number of data written to the dynamic memory array 110 is equal to the number of data input from external to the pseudo static random access memory 100, the comparer 123 enables the write match signal WRMTC to indicate that it is no longer necessary to make the speed of writing the data to the dynamic memory array 110 faster than the speed of inputting the data from external to the input output circuit 130. In other words, when the enabled write match signal WRMTC is received, the address strobe clock generator 124 converts the write operation from an asynchronous mode to a synchronous mode to adjust the cycle of the built-in clock signal CASP to be equal to the cycle of the reference clock signal CLK.

According to this embodiment, the first counter 121 and the second counter 122 may be a prior counting circuit having a counting function (but are not limited thereto). The controller 120 and the re-charge control circuit 140 may be a logic circuit composed with a plurality of logic gates (but are not limited thereto). The dynamic memory array 110 may be a prior dynamic random access memory (DRAM) but is not limited thereto. The input output circuit 130 may be performed with a structure of applied memory circuit that persons skilled in the art of integrated circuit are familiar with.

Figure 2:
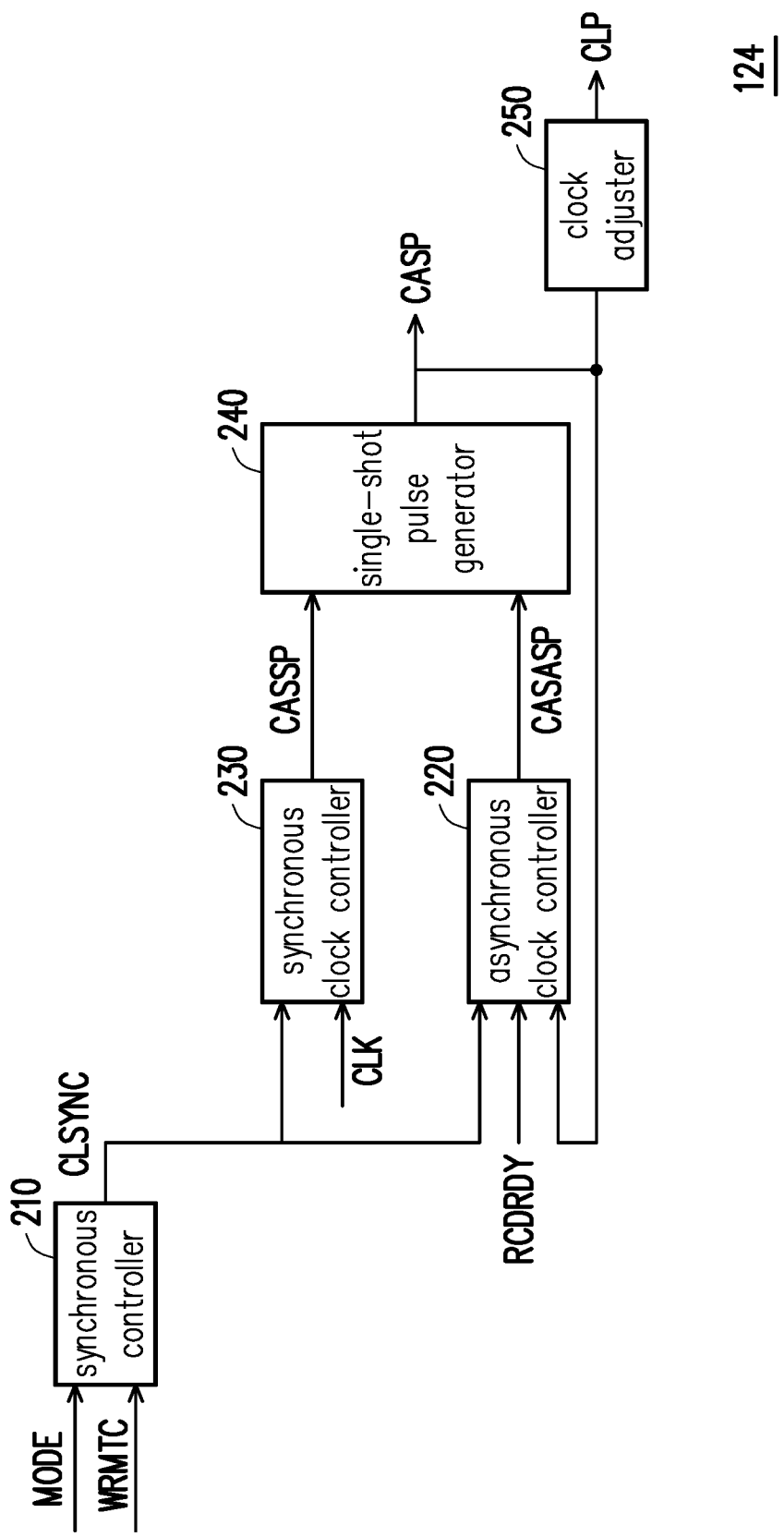
FIG. 2 is a schematic circuit diagram of an address strobe clock generator according to an embodiment of the invention.

Please refer to both FIG. 1 and FIG. 2 for the following. FIG. 2 is a schematic circuit diagram of an address strobe clock generator according to an embodiment of the invention. The address strobe clock generator 124 includes a synchronous controller 210, an asynchronous clock controller 220, a synchronous clock controller 230, a single-shot pulse generator 240 and a clock adjuster 250. After determining whether to perform the write operation or a read operation, the input command decoder 125 generates an operation signal MODE corresponding to the performed operation and a delay ready signal RCDRDY. The synchronous controller 210 receives the operation signal MODE and the write match signal WRMTC generated by the comparer 123, and enables a synchronous determine signal CLSYNC when the write match signal WRMTC is enabled in the write operation.

The asynchronous clock controller 220 receives the delay ready signal RCDRDY, the synchronous determine signal CLSYNC and the built-in clock signal CASP. When the delay ready signal RCDRDY is enabled and the synchronous determine signal CLSYNC is not enabled, it represents that the write operation is currently in the asynchronous mode, and thus the asynchronous clock controller 220 may generate an asynchronous base signal CASASP. Herein, the delay ready signal RCDRDY being enabled represents that, a system operation of row address, such as a word line and a sense amplifier, has finished driving and is ready for starting a system operation of column address. In other words, in the write operation, the data start to be written from the buffer of the input output circuit 130 to the memory unit of the dynamic memory array 110.

The synchronous clock controller 230 receives the reference clock signal CLK and the synchronous determine signal CLSYNC. When the synchronous determine signal CLSYNC is enabled, it represents that the write operation is currently converted to the synchronous mode, and the synchronous clock controller 230 may generate a corresponding synchronous base signal CASSP reflecting the reference clock signal CLK.

The single-shot pulse generator 240 receives the asynchronous base signal CASASP, the synchronous base signal CASSP and the delay ready signal RCDRDY and, when in the asynchronous mode, generates the corresponding built-in clock signal CASP reflecting the asynchronous base signal CASASP, when in the synchronous mode, generates corresponding the built-in clock signal CASP reflecting the synchronous base signal CASSP. Herein, the single-shot pulse generator 240 may, for example, select the asynchronous base signal CASASP and the synchronous base signal CASSP by an OR calculation and, reflecting the selected signal, generate a single-shot pulse having a predetermined pulse width to serve as the built-in clock signal CASP after the delay ready signal RCDRDY is enabled. The built-in clock signal CASP is further feedback to the asynchronous clock controller 220 so as to adjust the asynchronous base signal CASASP in subsequent processing.

The clock adjuster 250 receives the built-in clock signal CASP and may generate a control signal CLP reflecting the built-in clock signal CASP after a predetermined delay time.

Figure 3:
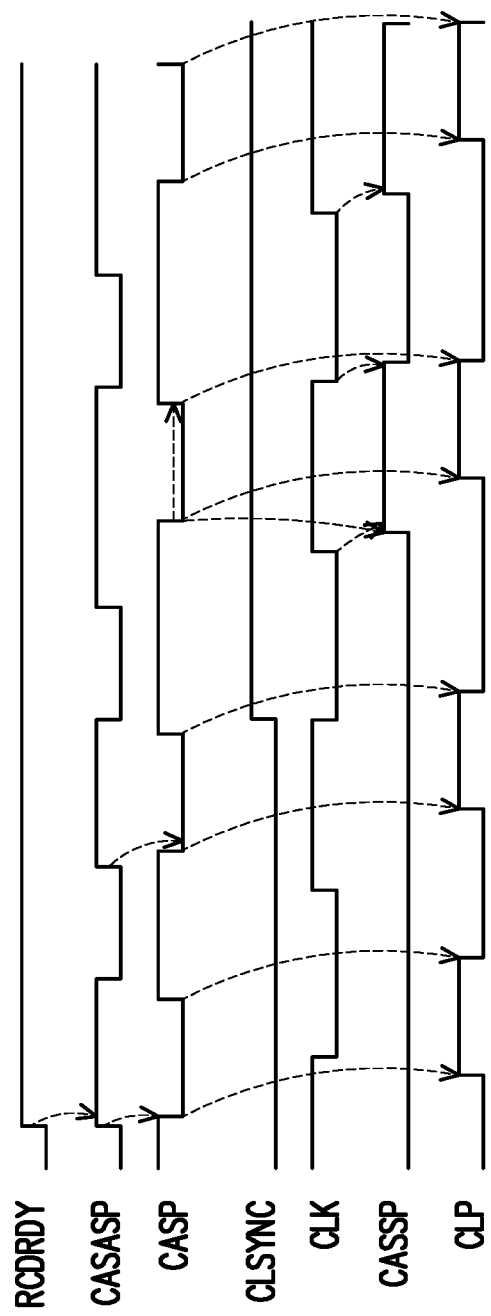
FIG. 3 is a schematic waveform chart of generating a built-in clock signal according to an embodiment of the invention.

Please refer to both FIG. 2 and FIG. 3 for the following. FIG. 3 is a schematic waveform chart of generating a built-in clock signal according to an embodiment of the invention. Details of generating the built-in clock signal are described as follows. In FIG. 3, first, when the delay ready signal RCDRDY is enabled (rises to a high logic level), the asynchronous clock controller 220 starts generating the asynchronous base signal CASASP. At the same time, the single-shot pulse generator 240 may, reflecting a rising edge of the asynchronous base signal CASASP, trigger the built-in clock signal CASP generating the single-shot pulse. Herein, a cycle of the asynchronous base signal CASASP is smaller than a cycle of the reference clock signal CLK. The control signal CLP, on the other hand, is generated by the clock adjuster 250 reflecting the built-in clock signal GASP after a predetermined delay time. In this embodiment, the built-in clock signal GASP is on a level opposite to a level of the control signal CLP, but the invention is not limited thereto.

Next, when the synchronous determine signal CLSYNC is enabled by the synchronous controller 210, it represents that the write operation is currently converted to the synchronous mode, and the synchronous clock controller 230 starts generating the corresponding synchronous base signal CASSP reflecting the reference clock signal CLK (for example, the synchronous base signal CASSP having a same cycle and a same pulse width as the reference clock signal CLK). Herein, the single-shot pulse generator 240 may, reflecting a rising edge of the synchronous base signal CASSP, trigger to generate the built-in clock signal GASP of the single-shot pulse, so as to adjust the cycle of the built-in clock signal GASP to be equal to the cycle of the reference clock signal CLK.

Figure 4:
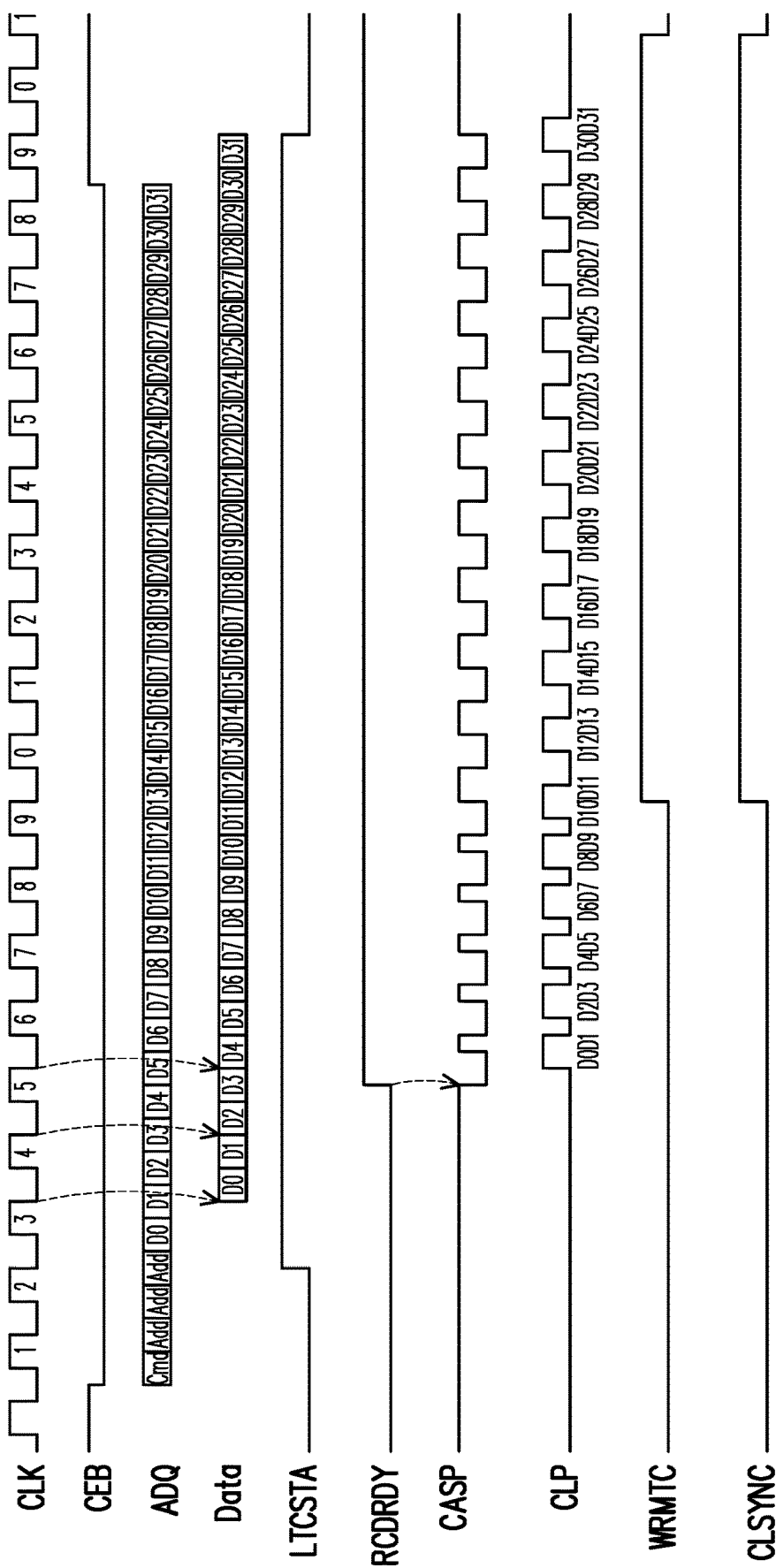
FIG. 4 is a schematic waveform chart of a write operation of a pseudo static random access memory according to an embodiment of the invention.

Please refer to FIG. 1, FIG. 2 and FIG. 4 for the following. FIG. 4 is a schematic waveform chart of a write operation of a pseudo static random access memory according to an embodiment of the invention. Regarding details of the write operation of the pseudo static random access memory 100, the input command decoder 125 of the pseudo static random access memory 100 receives from external the reference clock signal CLK, the data port signal ADQ and a chip enable signal CE, wherein the data port signal ADQ may, for example, include content of a command, an address and data. When the chip enable signal CE is enabled (pull down to a low logic level), before performing the write operation or the read operation, the input command decoder 125 determines whether a refresh request is received or not and, if the refresh request is received, performs a refresh action. Other details regarding to performing the refresh action are to be described later.

Next, the input command decoder 125 determines whether to perform the write operation or the read operation according to a command in the received data port signal ADQ. In this embodiment, the chip enable signal CE is a low active signal; in other words, the chip enable signal CE is a low logic level when enabled. Undoubtedly, in other embodiments of the invention, the chip enable signal CE may also be a high active signal, as there is no particular limitation thereto.

In FIG. 4, after it is determined to perform the write operation, data included in the data port signal ADQ (data DATA in FIG. 4) are input to the buffer of the input output circuit 130 in sequence with the reference clock signal CLK. No data are yet written to the dynamic memory array 110 before the delay ready signal RCDRDY is enabled.

When the delay ready signal RCDRDY is enabled, the single-shot pulse generator 240 of the address strobe clock generator 124 starts generating the built-in clock signal CASP in the asynchronous mode (The cycle of the built-in clock signal CASP is smaller than the cycle of the reference clock signal CLK). Herein, the data may be written to at least a memory unit in the dynamic memory array 110, the at least a memory unit corresponding to the address data, in sequence with the built-in clock signal CASP by the control signal CLP generated accordingly.

After the write operation starts, the first counter 121 starts counting the data input to the input output circuit 130 according to a count start signal LTCSTA generated by the input command decoder 125, and the second counter 122 counts the data written to the dynamic memory array 110 when a write flag signal WRFLG generated by the input command decoder 125 is enabled. When the above two numbers of data are equal, the comparer 123 enables the write match signal WRMTC, and the synchronous controller 210 enables the synchronous determine signal CLSYNC accordingly.

In FIG. 4, when the write match signal WRMTC and the synchronous determine signal CLSYNC are enabled (pull up to a high logic level), it represents that the write operation is converted from the asynchronous mode to the synchronous mode, and the single-shot pulse generator 240 of the address strobe clock generator 124 starts generating the built-in clock signal CASP in the synchronous mode (The cycle of the built-in clock signal CASP is equal to the cycle of the reference clock signal CLK). Herein, the data may be written to at least a memory unit in the dynamic memory array 110, the at least a memory unit corresponding to the address data, in sequence with the adjusted built-in clock signal CASP by the control signal CLP generated accordingly.

On the other hand, when the input command decoder 125 determines to perform the read operation according to a command in the data port signal ADQ received, the input output circuit 130 reads the data in the dynamic memory array 110 based on the built-in clock signal CASP. Herein, the cycle of the built-in clock signal CASP is equal to the cycle of the reference clock signal CLK. In specific, the data may read from at least a memory unit in the dynamic memory array 110, the at least a memory unit corresponding to the address data, in sequence with the built-in clock signal CASP, having a cycle same as the cycle of the reference clock signal CLK by the control signal CLP generated accordingly, so as to output the read data. All the above processes of reading are performed in the synchronous mode (The cycle of the built-in clock signal CASP is equal to the cycle of the reference clock signal CLK).

A pre-charge action is performed after the write operation or the read operation is completed. In FIG. 1, the pre-charge control circuit 140 is coupled to the input command decoder 125 and the comparer 123. When performing the write operation or the read operation, the pre-charge control circuit 140 detects whether the chip enable signal CE is disabled or not and, if the chip enable signal CE is disabled (which represents that the external write or read ends), performs a pre-charge action.

Figure 5:
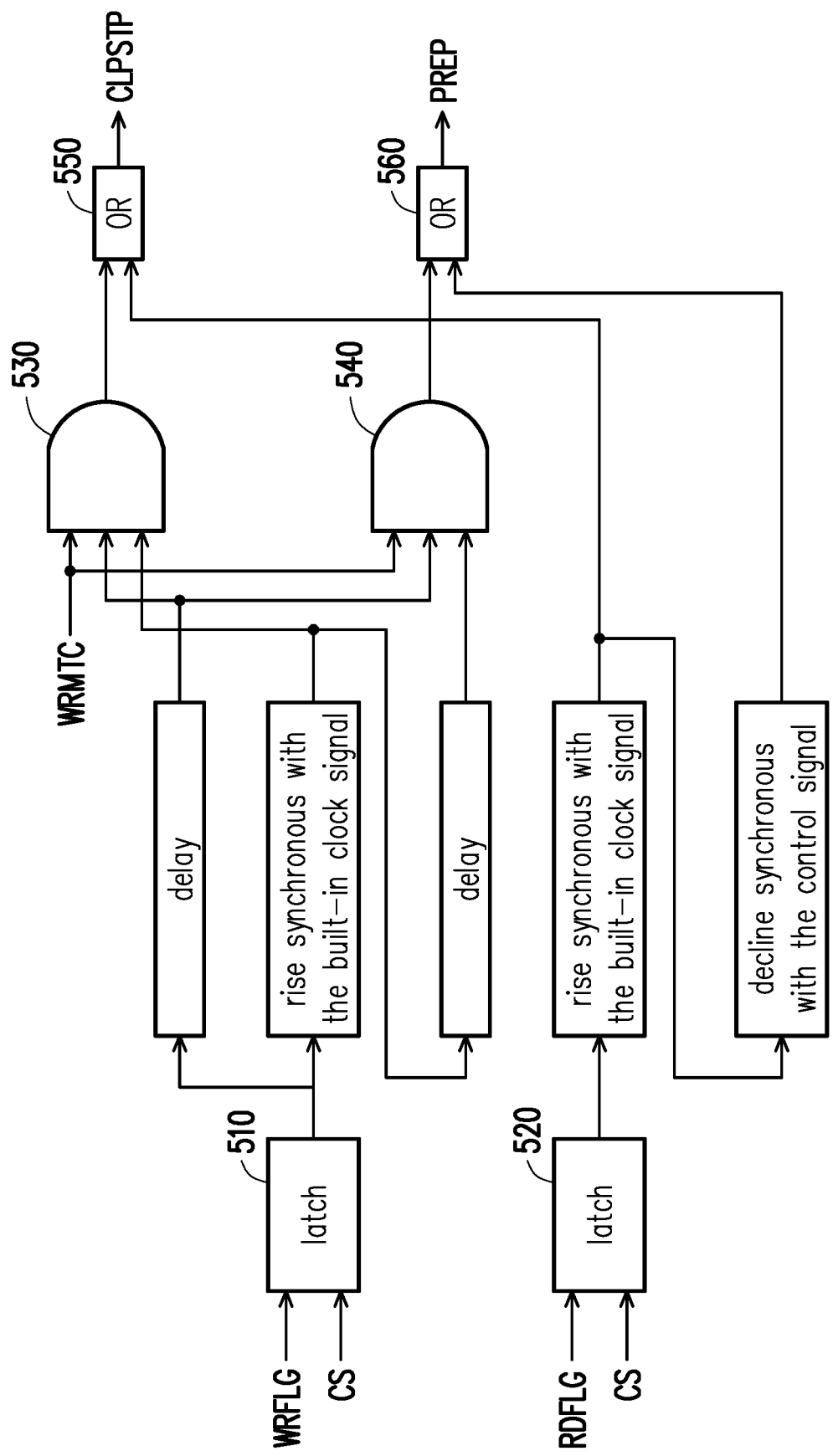
FIG. 5 is a schematic circuit diagram of a pre-charge control circuit according to an embodiment of the invention.

Please refer to both FIG. 1 and FIG. 5 for the following. FIG. 5 is a schematic circuit diagram of a pre-charge control circuit according to an embodiment of the invention. The input command decoder 125 determines whether to perform the write operation or the read operation according to a command in the data port signal ADQ received and outputs the write flag signal WRFLG and a read flag signal RDFLG accordingly. In addition, the input command decoder 125 also outputs a chip select signal CS according to the chip enable signal CE received.

In FIG. 5, a latch 510 receives the write flag signal WRFLG and the chip select signal CS. A latch 520 receives the read flag signal RDFLG and the chip select signal CS. A signal generated by the latch 510 may pass through a delay and transmitted to an AND gate 530 and an AND gate 540. The signal generated by the latch 510 may be transmitted to an AND gate 530 synchronizing to a rising of the built-in clock signal CASP, and the synchronized signal may further pass through a delay and transmitted to the AND gate 540. The AND gate 530 may perform an AND calculation together with the write match signal WRMTC and transmit the signal to an OR gate 550. The AND gate 540 may perform an AND calculation together with the write match signal WRMTC and transmit the signal to an OR gate 560.

The signal generated by the latch 520 may be transmitted to the OR gate 550 synchronizing to a rising of the built-in clock signal CASP, and the synchronized signal may further be transmitted to the OR gate 560 synchronizing to a decline of the control signal CLP. A control end signal CLPSTP is generated by the calculation by the OR gate 550. A pre-charge signal PREP is generated by the calculation by the OR gate 560 to inform to perform the pre-charge action.

Figure 6:
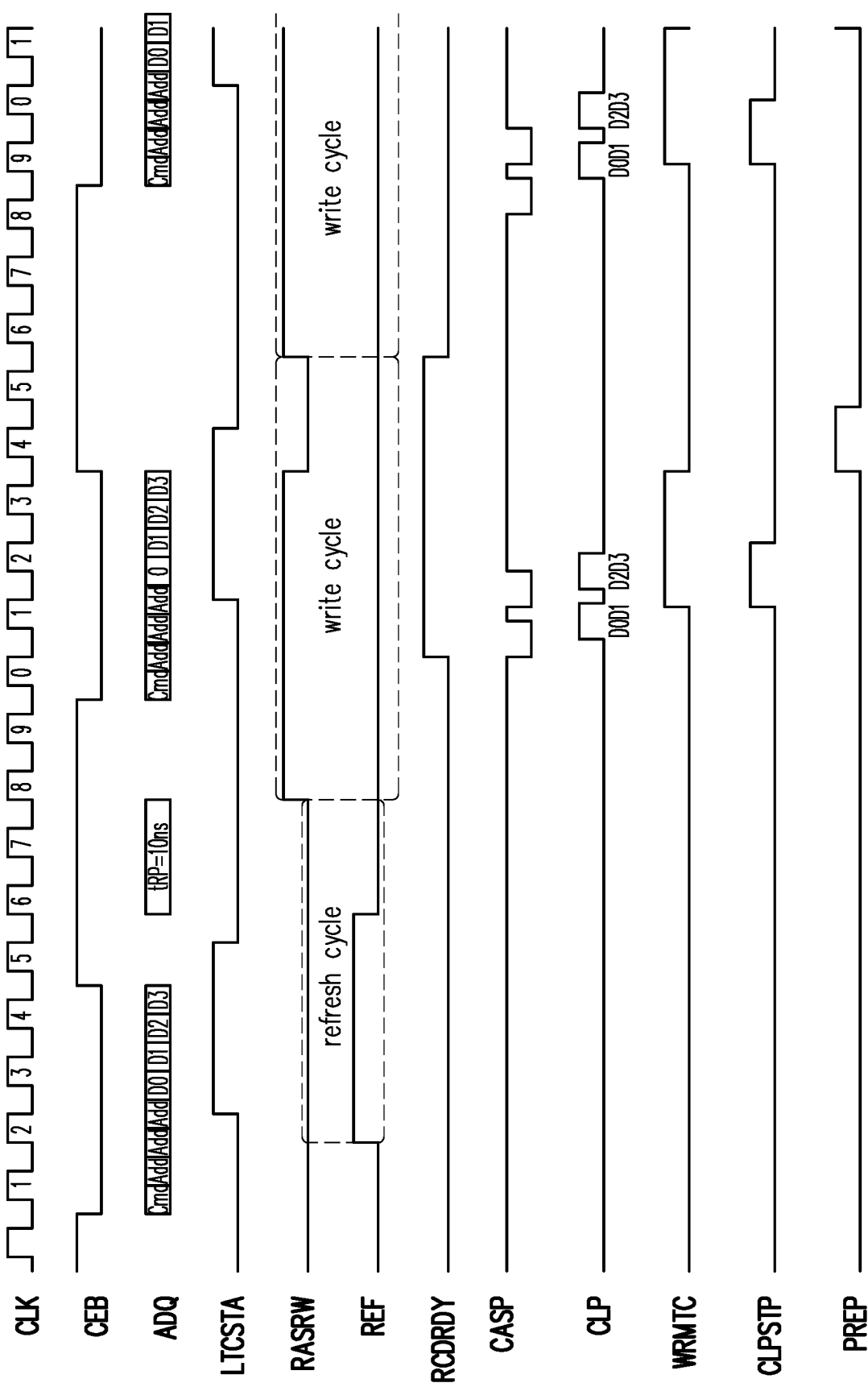
FIG. 6 is a schematic waveform chart of a refresh action in a write operation of a pseudo static random access memory according to an embodiment of the invention.

Please refer to FIG. 6 for the following. FIG. 6 is a schematic waveform chart of a refresh action in a write operation of a pseudo static random access memory according to an embodiment of the invention. In FIG. 6, the refresh request is sent soon after the chip enable signal CE is enabled, and the refresh action may be performed before the write operation.

In FIG. 6, a refresh request signal REF is enabled soon after the chip enable signal CE is enabled. In this embodiment, the refresh request signal REF is, for example, enabled regularly by a timer (not illustrated).

In this embodiment, there is no write delay, and the input data are stored in a first-in and first-out buffer (FIFO buffer) of a part of the input output circuit 130 before the actual write operation.

As shown in FIG. 6, in this embodiment, after the refresh action ends, an operation drive signal RASRW is enabled to inform to start performing the write operation. In other words, in this embodiment, the refresh action may be performed outside from cycles of a plurality of write operations. In this example, the refresh action corresponds to 5 write operations at most, such that a longer time is provided to perform the refresh action.

Figure 7:
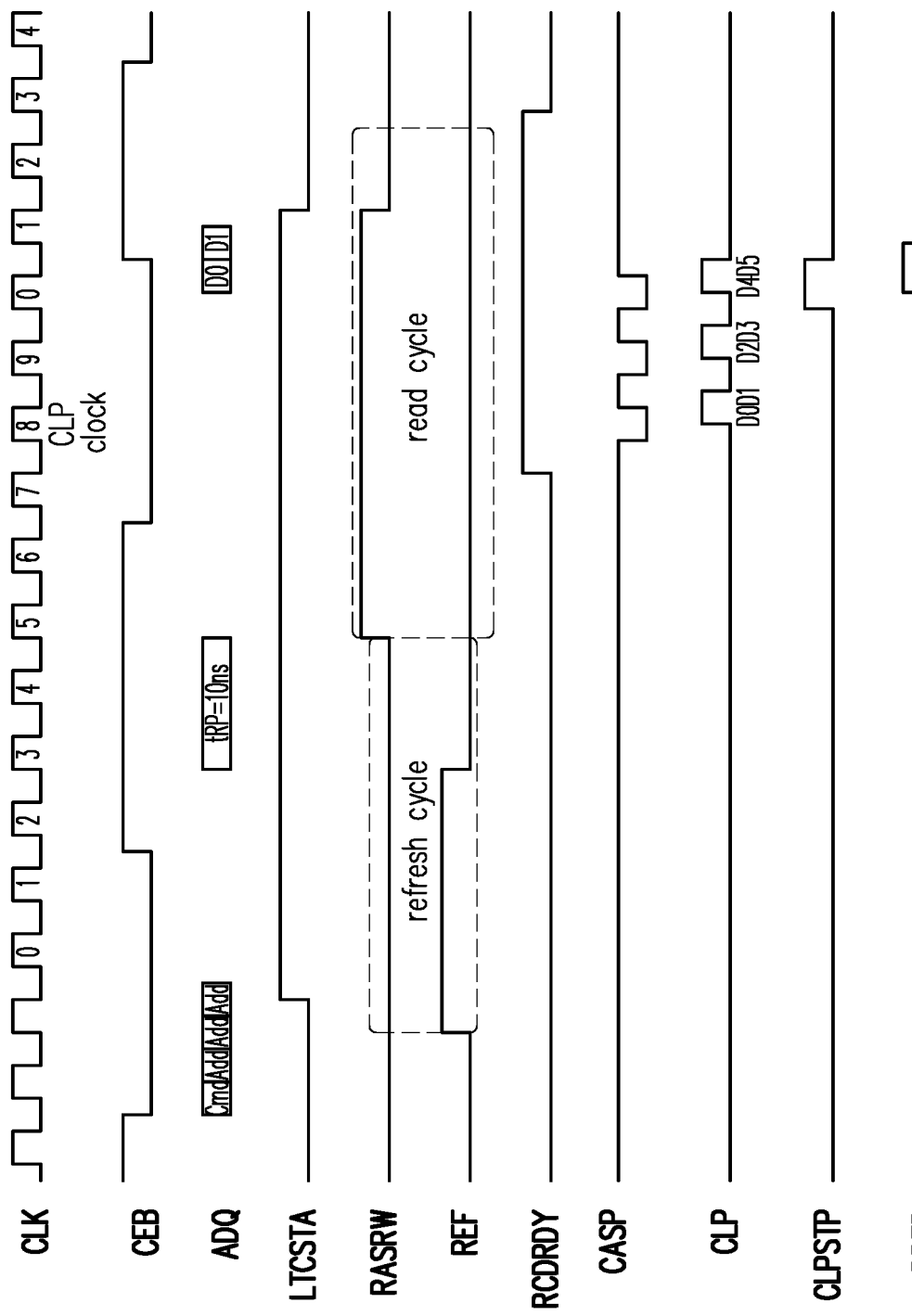
FIG. 7 is a schematic waveform chart of a refresh action in a read operation of a pseudo static random access memory according to an embodiment of the invention.

Please refer to FIG. 7 for the following. FIG. 7 is a schematic waveform chart of a refresh action in a read operation of a pseudo static random access memory according to an embodiment of the invention. In FIG. 7, the refresh request is sent soon after the chip enable signal CE is enabled, and the refresh action may be performed before the read operation.

In FIG. 7, a refresh request signal REF is enabled soon after the chip enable signal CE is enabled. In this embodiment, the refresh request signal REF is, for example, enabled regularly by a timer (not illustrated).

As shown in FIG. 7, in this embodiment, after the refresh action ends, an operation drive signal RASRW is enabled to inform to start performing the read operation. A first control signal CLP is generated at the back of a first CLP clock and the delay ready signal RCDRDY in FIG. 7. In this example, a read delay was originally set to be 5 clocks but is extended to be 10 clocks because the refresh request signal REF appears before the read operation.

Figure 8:
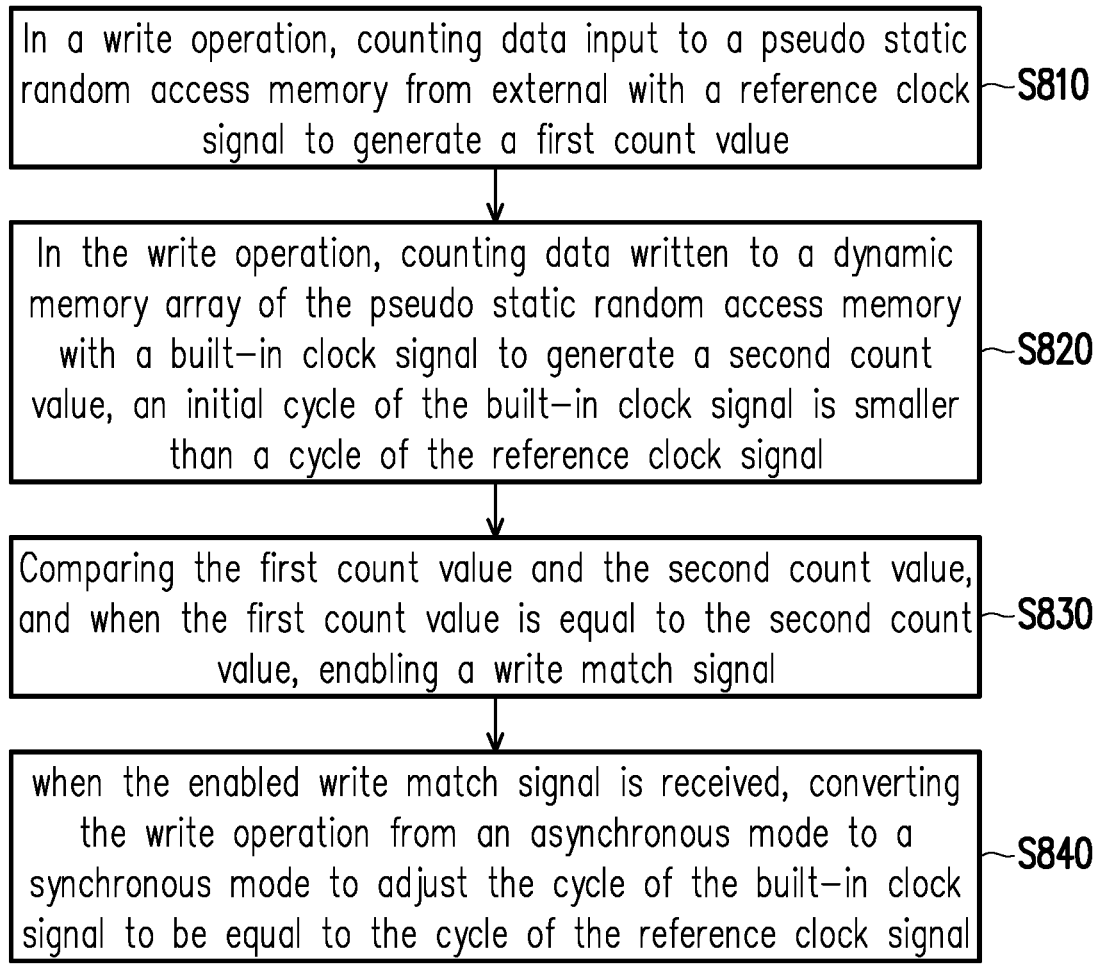
FIG. 8 is a schematic flow chart of a control method of a pseudo static random access memory according to an embodiment of the invention.

FIG. 8 is a schematic flow chart of a control method of a pseudo static random access memory according to an embodiment of the invention. Referring to both FIG. 1 and FIG. 8, in step S810, in the write operation, the first counter 121 counts data input to the pseudo static random access memory 100 from external with the reference clock signal CLK to generate the first count value FCV. In step S820, in the write operation, the second counter 122 counts data written to the dynamic memory array 110 of the pseudo static random access memory 100 with the built-in clock signal CASP to generate a second count value SCV, and the initial cycle of the built-in clock signal CASP is smaller than the cycle of the reference clock signal CLK. In step S830, the comparer 123 compares the first count value FCV and the second count value SCV and enables the write match signal WRMTC when the first count value FCV is equal to the second count value SCV. In step S840, when the enabled write match signal WRMTC is received, the address strobe clock generator 124 converts the write operation from the asynchronous mode to the synchronous mode to adjust the cycle of the built-in clock signal CASP to be equal to the cycle of the reference clock signal CLK. Details of each step have been specified in the foregoing examples and embodiments of the invention and thus are not repeated hereinafter.

Figure 9:
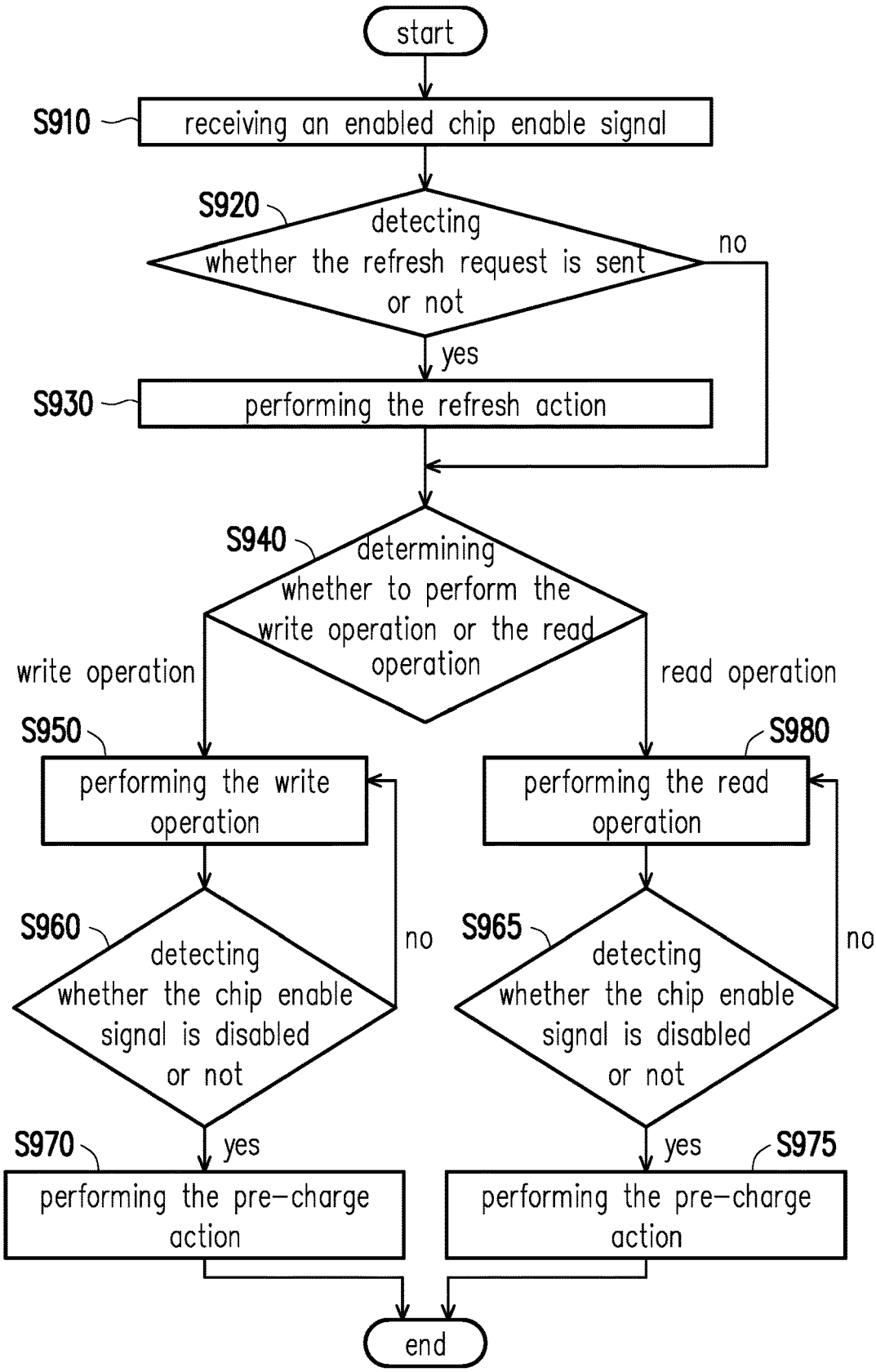
FIG. 9 is a schematic flow chart of a control method of a pseudo static random access memory according to an embodiment of the invention.

FIG. 9 is a schematic flow chart of a control method of a pseudo static random access memory according to an embodiment of the invention. FIG. 9 illustrates examples of determining the write operation and read operation, performing the refresh action and the processes of the pre-charge action.

Referring to FIG. 9, in step S910, the enabled chip enable signal CE is received, which represents that the write operation or the read operation is to be performed. In step S920, it is detected whether the refresh request is sent or not. If the refresh request is detected, the refresh action is performed in step S930. In step S940, it is determined whether to perform the write operation or the read operation. If it is determined to perform the write operation, the write operation is performed in step S950. In step S960, it is detected whether the chip enable signal is disabled or not. If the chip enable signal is disabled, it represents that the write operation ends, and the pre-charge action is performed in step S970. If it is determined to perform the read operation, the read operation is performed in step S980. In step S965, it is detected whether the chip enable signal is disabled or not. If the chip enable signal is disabled, it represents that the read operation ends, and the pre-charge action is performed in step S975. Details of each step have been specified in the foregoing examples and embodiments of the invention and thus are not repeated hereinafter.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A control method adapted for a pseudo static random access memory, comprising:
   in a write operation, counting data input to the pseudo static random access memory from external with a reference clock signal to generate a first count value;
   in the write operation, counting data written to a dynamic memory array of the pseudo static random access memory with a built-in clock signal to generate a second count value, an initial cycle of the built-in clock signal is smaller than a cycle of the reference clock signal;
   comparing the first count value and the second count value, when the first count value is equal to the second count value, enabling a write match signal; and
   when the enabled write match signal is received, converting the write operation from an asynchronous mode to a synchronous mode to adjust the cycle of the built-in clock signal to be equal to the cycle of the reference clock signal.

2. The control method according to claim 1, further comprising:
   receiving a chip enable signal from external; and
   when the chip enable signal is enabled, determining whether to perform the write operation or a read operation according to a received command, the step of determining whether to perform the write operation or the read operation comprises:
  before performing the write operation or the read operation, determining whether a refresh request is received or not; and
  if the refresh request is received, performing a refresh action.

3. The control method according to claim 2, wherein after the step of enabling the write match signal, the control method further comprises:
  detecting whether the chip enable signal is disabled or not; and
  if the chip enable signal is disabled, performing a pre-charge action.

4. The control method according to claim 1, wherein converting the write operation from the asynchronous mode to the synchronous mode to adjust the cycle of the built-in clock signal to be equal to the cycle of the reference clock signal comprises:
  providing a delay ready signal;
  in the write operation, when the write match signal is enabled, enabling a synchronous determine signal;
  when the delay ready signal is enabled and the synchronous determine signal is not enabled, generating an asynchronous base signal;
  when the synchronous determine signal is enabled, generating a corresponding synchronous base signal reflecting the reference clock signal;
  when in the asynchronous mode, generating the corresponding built-in clock signal reflecting the asynchronous base signal, when in the synchronous mode, generating the corresponding built-in clock signal reflecting the synchronous base signal; and
  receiving the built-in clock signal and generating a control signal reflecting the built-in clock signal after a predetermined delay time.

5. The control method according to claim 2, further comprising:
  in the read operation, reading data of the dynamic memory array with the built-in clock signal, wherein the cycle of the built-in clock signal is equal to the cycle of the reference clock signal.

6. A pseudo static random access memory, comprising:
  a dynamic memory array;
  a controller coupled to the dynamic memory array; and
  an input output circuit, coupled to the dynamic memory array and the controller, wherein
  the controller comprises:
    a first counter, in a write operation, the first counter counting data input to the pseudo static random access memory from external with a reference clock signal to generate a first count value;
    a second counter, in the write operation, the second counter counting data written to the dynamic memory array with a built-in clock signal to generate a second count value, an initial cycle of the built-in clock signal is smaller than a cycle of the reference clock signal;
    a comparer coupled to the first counter and the second counter, the comparer comparing the first count value and the second count value and, when the first count value is equal to the second count value, enabling a write match signal; and
    an address strobe clock generator coupled to the comparer, when the enabled write match signal is received, the address strobe clock generator converting the write operation from an asynchronous mode to a synchronous mode to adjust the cycle of the built-in clock signal to be equal to the cycle of the reference clock signal.

7. The pseudo static random access memory according to claim 6, wherein the controller further comprises:
  an input command decoder coupled to the dynamic memory array, the input output circuit and the address strobe clock generator, the input command decoder receiving a chip enable signal from external and, when the chip enable signal is enabled, determining whether to perform the write operation or a read operation according to a received command,
  before performing the write operation or the read operation, the input command decoder determines whether a refresh request is received or not and, if the refresh request is received, performs a refresh action.

8. The pseudo static random access memory according to claim 7, further comprising:
  a pre-charge control circuit coupled to the input command decoder and the comparer, during performing the write operation or the read operation, the pre-charge control circuit detecting whether the chip enable signal is disabled or not and, if the chip enable signal is disabled, performing a pre-charge action, wherein
  after determining whether to perform the write operation or a read operation, the input command decoder generates an operation signal corresponding to the performed operation and a delay ready signal,
  the address strobe clock generator comprises:
  a synchronous controller receiving the operation signal and the write match signal and, in the write operation, when the write match signal is enabled, enabling a synchronous determine signal;
  an asynchronous clock controller receiving the delay ready signal, the synchronous determine signal and the built-in clock signal and, when the delay ready signal is enabled and the synchronous determine signal is not enabled, generating an asynchronous base signal;
  a synchronous clock controller receiving the reference clock signal and the synchronous determine signal, when the synchronous determine signal is enabled, generating a corresponding synchronous base signal reflecting the reference clock signal; and
  a single-shot pulse generator, receiving the asynchronous base signal, the synchronous base signal and the delay ready signal and, when in the asynchronous mode, generating the corresponding built-in clock signal reflecting the asynchronous base signal, when in the synchronous mode, generating the corresponding built-in clock signal reflecting the synchronous base signal.

9. The pseudo static random access memory according to claim 8, the address strobe clock generator further comprising:
  a clock adjuster coupled to the single-shot pulse generator, receiving the built-in clock signal and generating a control signal reflecting the built-in clock signal after a predetermined delay time.

10. The pseudo static random access memory according to claim 9, wherein in the read operation, the input output circuit reads data of the dynamic memory array with the built-in clock signal, wherein the cycle of the built-in clock signal is equal to the cycle of the reference clock signal.

\* \* \* \* \*

UNITED STATES PATENT AND TRADEMARK OFFICE
CERTIFICATE OF CORRECTION

PATENT NO. : 10,665,286 B2  
APPLICATION NO. : 16/177461  
DATED : May 26, 2020  
INVENTOR(S) : Kaoru Mori et al.

Page 1 of 1

It is certified that error appears in the above-identified patent and that said Letters Patent is hereby corrected as shown below:

On the Title Page

Item (73) Assignee should read: Winbond Electronics Corp., Taichung (TW)

Signed and Sealed this  
Twenty-fifth Day of August, 2020

Andrei Iancu  
*Director of the United States Patent and Trademark Office*